United States Patent
Kobayashi et al.

(10) Patent No.: US 9,811,129 B2
(45) Date of Patent: Nov. 7, 2017

(54) METHOD OF CONTROLLING AIR CONDITIONING, AIR-CONDITIONING CONTROL SYSTEM AND AIR-CONDITIONING CONTROL APPARATUS

(75) Inventors: Hiroki Kobayashi, Kawasaki (JP);
Yuichi Sato, Yamato (JP); Sachio Kobayashi, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 765 days.

(21) Appl. No.: 13/562,732

(22) Filed: Jul. 31, 2012

(65) Prior Publication Data
US 2013/0042639 A1    Feb. 21, 2013

(30) Foreign Application Priority Data

Aug. 16, 2011 (JP) .................. 2011-177945

(51) Int. Cl.
*F25D 17/04* (2006.01)
*G06F 1/20* (2006.01)
*H05K 7/20* (2006.01)

(52) U.S. Cl.
CPC .......... *G06F 1/206* (2013.01); *H05K 7/20836* (2013.01); *Y02B 60/1275* (2013.01)

(58) Field of Classification Search
CPC .......... H05K 7/20745; H05K 7/20836; H05K 7/20736; H05K 7/20209; H05K 7/207; H05K 7/2059; H05K 7/20572; G06F 1/206
See application file for complete search history.

(56) References Cited

U.S. PATENT DOCUMENTS

| | | | |
|---|---|---|---|
| 2006/0016901 A1* | 1/2006 | Beitelmal et al. | 236/49.3 |
| 2006/0168975 A1 | 8/2006 | Malone et al. | |
| 2007/0097636 A1* | 5/2007 | Johnson et al. | 361/695 |
| 2007/0110077 A1* | 5/2007 | Takashige | H04L 12/4675 370/395.53 |
| 2007/0209653 A1* | 9/2007 | Beisheim | F23N 3/002 126/80 |
| 2008/0108295 A1* | 5/2008 | Fischer et al. | 454/239 |
| 2008/0126492 A1* | 5/2008 | Guidi et al. | 709/206 |

(Continued)

FOREIGN PATENT DOCUMENTS

| | | |
|---|---|---|
| JP | 2006-208000 | 8/2006 |
| JP | 2009-157838 | 7/2009 |
| JP | 2010-108324 | 5/2010 |

*Primary Examiner* — Larry Furdge
(74) *Attorney, Agent, or Firm* — Staas & Halsey LLP

(57) ABSTRACT

A method of controlling air conditioning to cool servers, the method includes selecting, when the number of operating servers is a certain threshold number or more, a first mode, in which the pressure of a cold aisle is set higher than the pressure of a hot aisle; selecting, when the number of operating servers is less than the certain threshold number, a second mode, in which the pressure of the cold aisle is set equal to the pressure of the hot aisle; and informing the operating servers of whether a current mode is the first mode or the second mode, and when the current mode is the first mode, driving fans of the servers at a minimum rotational speed in a specification, and when the current mode is the second mode, driving the fans of the servers at a rotational speed higher than the minimum rotational speed in the specification.

12 Claims, 8 Drawing Sheets

(56) References Cited

U.S. PATENT DOCUMENTS

2009/0168333 A1     7/2009   Saito et al.
2009/0326721 A1*   12/2009   Sugiyama et al. ............ 700/282
2012/0041600 A1*    2/2012   Michael et al. .............. 700/276

* cited by examiner

METHOD OF CONTROLLING AIR CONDITIONING, AIR-CONDITIONING CONTROL SYSTEM AND AIR-CONDITIONING CONTROL APPARATUS

CROSS-REFERENCE TO RELATED APPLICATION(S)

This application is based upon and claims the benefit of priority of the prior Japanese Patent Application No. 2011-177945, filed on Aug. 16, 2011, the entire contents of which are incorporated herein by reference.

FIELD

The embodiment discussed herein is related to a method of controlling air conditioning, an air-conditioning control system, and an air-conditioning control apparatus.

BACKGROUND

A computer normally incorporates units that dissipate heat during operation, such as a central processing unit (CPU) and a hard disk drive (HDD). When these units are overheated, operation of the computer may become unstable. Units, such as the CPU or HDD, may be deformed by heat. Several methods for cooling a computer to avoid such a situation have been known.

For example, a method of detecting an airflow in a data center in which a plurality of servers are disposed, and cooling the servers based on the detected airflow has been known. Also, a method of detecting the temperature of each server, and controlling a cooling fan built in the server according to the temperature is provided. Further, a method of adjusting the number of revolutions of a cooling fan so that an estimated temperature becomes lower than a given temperature is known. The method involves estimating a CPU temperature after a certain time period, based on the usage rate and temperature of a CPU, the number of revolutions of a cooling fan, and a supply air temperature.

As a related art, for example, Japanese Laid-open Patent Publication Nos. 2006-208000, 2009-157838, and 2010-108324 have been disclosed.

SUMMARY

According to an aspect of the invention, a method of controlling air conditioning to cool servers that are disposed in a data center that has a cold aisle and a hot aisle and that conduct air circulation between the cold aisle and the hot aisle, the method, which causes an air-conditioning control apparatus configured to control an air conditioner to supply cold air to the cold aisle and to suck hot air out of the hot aisle includes obtaining data that indicates a number of operating servers in the data center; selecting, when the number of operating servers is a certain threshold number or more, a first mode, in which the pressure of the cold aisle is set higher than the pressure of the hot aisle by a certain difference in pressure, as a mode of controlling the air conditioner; selecting, when the number of operating servers is less than the certain threshold number, a second mode, in which the pressure of the cold aisle is set equal to the pressure of the hot aisle, as a mode of controlling the air conditioner; and informing the operating servers of whether a current mode is the first mode or the second mode, and if the current mode is the first mode, driving fans of the operating servers at a minimum rotational speed as given in a specification, and when the current mode is the second mode, driving the fans of the operating servers at a rotational speed higher than the minimum rotational speed given in the specification.

The object and advantages of the invention will be realized and attained by means of the elements and combinations particularly pointed out in the claims.

It is to be understood that both the foregoing general description and the following detailed description are an example of a and explanatory and are not restrictive of the invention, as claimed.

DESCRIPTION OF EMBODIMENT

A technique described below is based on the assumption that a data center includes a cold aisle, which is also referred to as a cold air aisle, and a hot aisle, which is also referred to as a hot air aisle, that are separated from each other. In the present technique, an air conditioner for cooling servers in such a data center is controlled based on air pressures of the cold aisle and the hot aisle, and fans mounted on the individual servers are also controlled in conjunction with the air conditioner. By the present technique, it is possible to reduce overall power consumption of the data center that is demanded to cool the servers.

Figure 1:
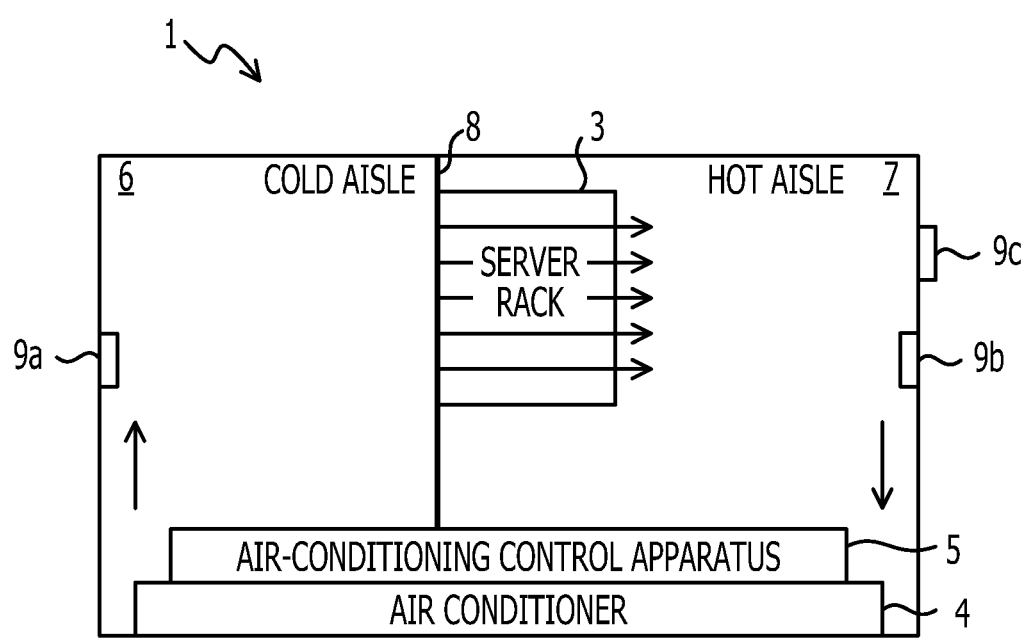
FIG. 1 is a plan view illustrating an example of a data center.
Figure 2:
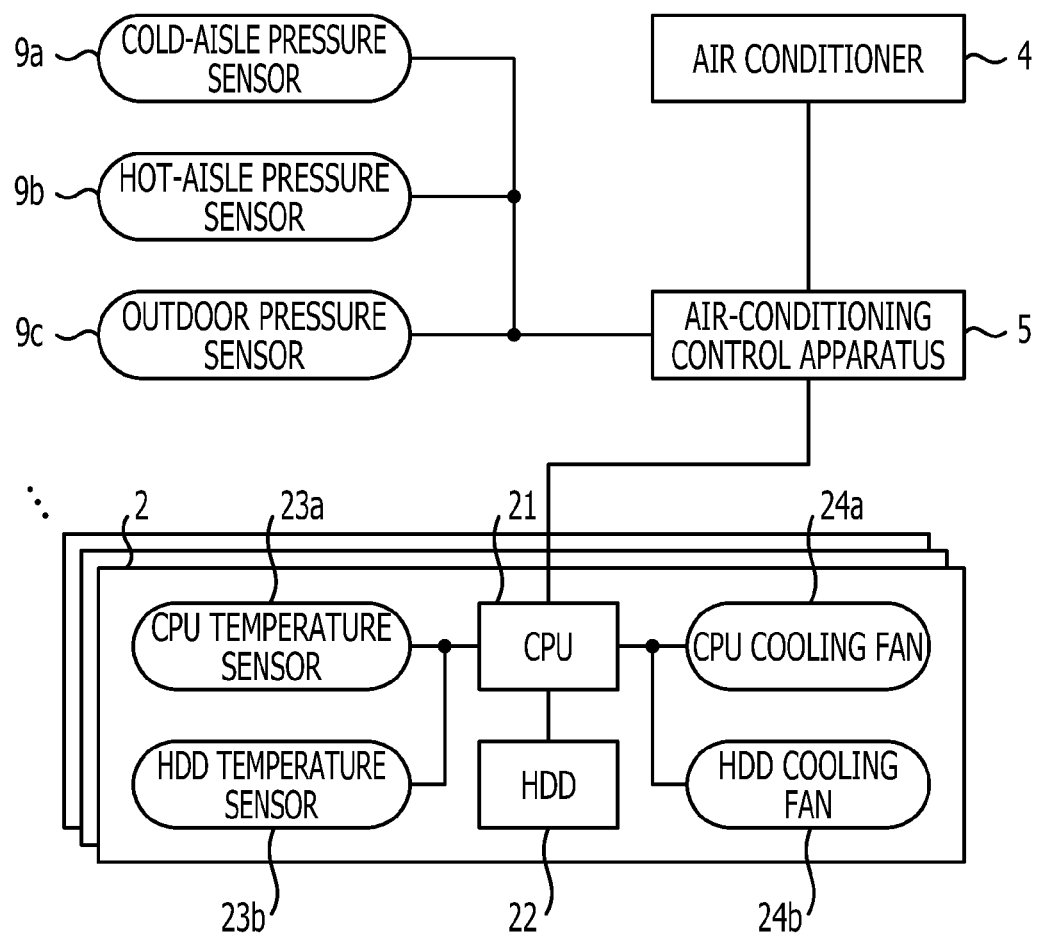
FIG. 2 is a diagram illustrating an example of a network in the data center.

Descriptions are given of a data center according to an embodiment and a network configuration inside of the data center with reference to FIG. 1 and FIG. 2. FIG. 1 is a plan view illustrating an example of a data center 1. FIG. 2 is a diagram illustrating an example of a network in the data center 1. As illustrated in FIG. 1, the data center 1 includes a server rack 3 in which a plurality of servers 2 illustrated in FIG. 2 are held, an air conditioner 4 that includes an air conditioner fan, an air-conditioning control apparatus 5, a cold aisle 6, and a hot aisle 7.

The cold aisle 6 and the hot aisle 7 are both isolated from air from outside the data center 1. That is to say, the data center 1 is approximately airtight. The cold aisle 6 and the hot aisle 7 are separated by a partition 8. Air circulation between the cold aisle 6 and the hot aisle 7 is carried out only through the server rack 3. In this regard, as an example of a data center having such an approximately airtight structure and air circulation structure, a container-type data center in which servers are accommodated in a freight transportation container is given.

Cold air is supplied to the cold aisle 6 from the air conditioner 4 under the control of the air-conditioning control apparatus 5. The cold air supplied to the cold aisle 6 passes the server rack 3, and absorbs heat exhausted from the servers 2 at that time, and becomes hot air. The hot air moves to the hot aisle 7. The air conditioner 4 sucks the hot air that has moved to the hot aisle 7, and cools the sucked-in hot air by heat exchange or by exchange with outside air to produce cold air. The air conditioner 4 supplies the cold air to the cold aisle 6. In this manner, the servers 2 in the data center 1 are cooled.

A description is given later of a mechanism of generating an airflow from the cold aisle 6 to the hot aisle 7.

Next, a description is given of a configuration of the servers 2 mounted on the server rack 3 with reference to FIG. 2. The servers 2 include a central processing unit (CPU) 21, and a hard disk drive (HDD) 22. In addition, the servers 2 include a CPU temperature sensor 23a that detects the temperature of the CPU 21, and an HDD temperature sensor 23b that detects the temperature of the HDD 22. Furthermore, the servers 2 include a CPU cooling fan 24a that cools the CPU 21, and an HDD cooling fan 24b that cools the HDD 22. Either one of or both of the CPU cooling fan 24a and the HDD cooling fan 24b are also called server fans.

The CPU temperature sensor 23a and the HDD temperature sensor 23b send detected temperature information to the CPU 21. The CPU cooling fan 24a rotates under the control of the CPU 21 so as to suck cold air from the cold aisle 6 to send the air to the CPU 21 in order to cool the CPU 21. The CPU cooling fan 24a exhausts hot air generated by the cooling to the hot aisle 7. The HDD cooling fan 24b also cools the HDD 22 in the same manner. The servers 2 are connected to the air-conditioning control apparatus 5 through a network.

In addition to the CPU 21 and the HDD 22 illustrated in FIG. 2, the servers 2 include a memory unit, a display unit, an input device, a drive unit for reading from and writing to a recording medium, such as a CD-ROM or the like, and an interface unit for connecting with the air-conditioning control apparatus 5.

In addition to the servers 2, the air-conditioning control apparatus 5 is connected to a cold-aisle pressure sensor 9a that detects pressure of the cold aisle 6, a hot-aisle pressure sensor 9b that detects pressure of the hot aisle 7, and an outdoor pressure sensor 9c that detects pressure outside of the data center 1. The pressure values detected by the pressure sensors 9a to 9c are sent to the air-conditioning control apparatus 5.

The air-conditioning control apparatus 5 controls the air conditioner 4 based on the pressure values detected by the pressure sensors 9a to 9c as well as the number of the servers 2 in operation. Specifically, the air-conditioning control apparatus 5 controls the air conditioner 4 so as to satisfy the following expression.

$$\text{pressure of hot aisle 7} \approx \text{outdoor pressure} \quad (1)$$

$$\text{pressure of cold aisle 6} = \text{pressure of hot aisle 7} + \text{set pressure difference} \quad (2)$$

Here, the set pressure difference in Expression (2) may be a certain positive value $\Delta P$ or 0. A mode in which the air conditioner 4 is controlled so that the set pressure difference becomes $\Delta P$ is called a first mode. A mode in which the air conditioner 4 is controlled so that the set pressure difference becomes 0 is called a second mode. In the data center 1, if the number of operating servers 2 is a certain threshold number x or more, the air conditioner 4 is controlled in the first mode, otherwise the air conditioner 4 is controlled in the second mode. The positive value $\Delta P$ and the threshold number x are numeric values that are calculated uniquely for the data center 1. A description of a method of calculating the numeric values will be given later.

In the first mode, the air conditioner 4 is controlled so that the pressure of the cold aisle 6 becomes higher than the pressure of the hot aisle 7 by $\Delta P$. Due to the difference between the pressure of the cold aisle 6 and the pressure of the hot aisle 7, an airflow arises from the cold aisle 6 to the hot aisle 7. Thereby, the servers 2 are cooled. From the air-conditioning control apparatus 5, the servers 2 are informed that the current control mode is the first mode. The servers 2 that have received information regarding the first mode rotate the server fans at a minimum rotational speed as given in a specification. For example, if the minimum rotational speed in the specification is 0, that is to say, if the specification allows the server fans to be stopped while the servers are in operation, the servers 2 stop the server fans. Alternatively, if the specification does not allow the server fans to be stopped while the servers are in operation, the servers 2 rotate the server fans at the minimum rotational speed allowed in the specification. In this manner, "rotate the server fans at the minimum rotational speed in a specification" means that, as much as possible, the server fans are not rotated. Only if any of the servers 2 is overheated, is the rotational speed of the overheated server fan increased so that the quantity of airflow is increased.

On the other hand, in the second mode, the set pressure difference is 0, and thus the pressure of the cold aisle 6 becomes equal to the pressure of the hot aisle 7. The servers 2 that are operating receive information that the current mode is the second mode from the air-conditioning control apparatus 5, and rotate their own server fans. Thereby, airflow from the cold aisle 6 to the hot aisle 7 arises, and thus the servers 2 that are operating are cooled.

Figure 3:
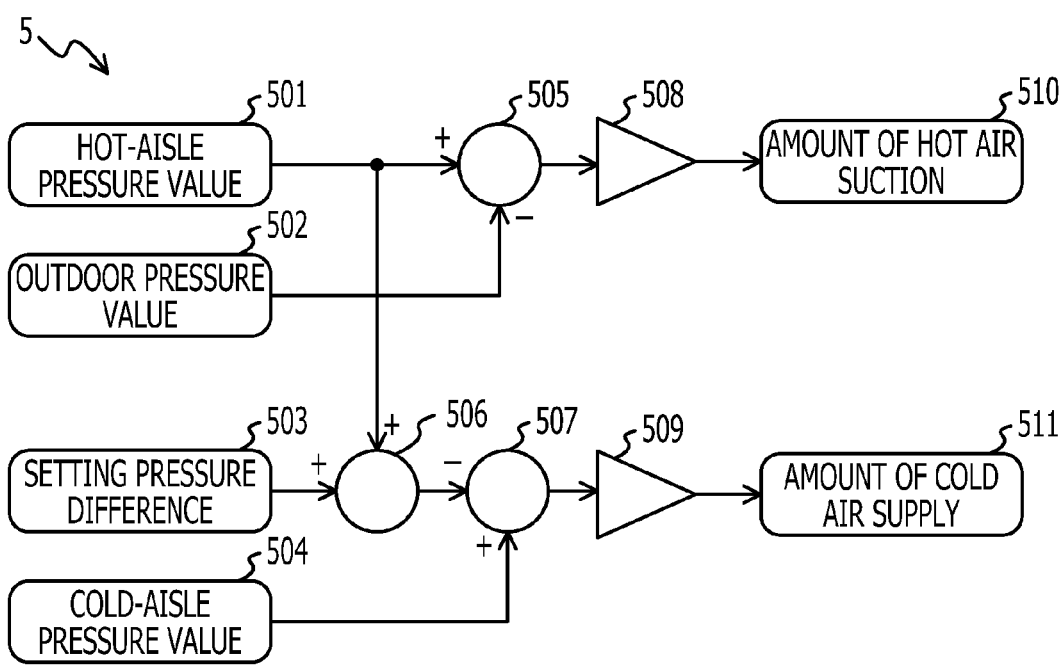
FIG. 3 is a diagram illustrating an example of an air-conditioning control apparatus.

FIG. 3 is a diagram illustrating an example of an air-conditioning control apparatus 5. A hot aisle pressure value 501, an outdoor pressure value 502, and a cold aisle pressure value 504 are pieces of information sent from the hot-aisle pressure sensor 9b, the outdoor pressure sensor 9c, and the cold-aisle pressure sensor 9a, respectively. A set pressure difference 503 between the cold aisle 6 and the hot aisle 7 is a certain positive value $\Delta P$ or 0 as described above. The air-conditioning control apparatus 5 controls the air conditioner 4 so that the set pressure difference 503 is generated.

A subtracter 505 subtracts the outdoor pressure value 502 from the hot-aisle pressure value 501, and outputs the value obtained to a feedback gain 508. The feedback gain 508 receives the value, and calculates an amount of hot air suction 510 of the air conditioner 4 so that the pressure of the hot aisle 7 becomes substantially equal to the outdoor pressure.

The adder 506 outputs a sum of the hot-aisle pressure value 501 and the pressure difference 503 to a subtracter 507. The subtracter 507 subtracts the sum from the cold aisle pressure value 504, and outputs the value obtained to a feedback gain 509. The feedback gain 509 receives the value, and calculates an amount of cold air supply 511 of the air conditioner 4 so that the pressure of the cold aisle 6 either becomes higher than the pressure of the hot aisle 7 by a given value $\Delta P$ or becomes equal to the pressure of the hot aisle 7.

Here, a description will be given of a method to calculate the value ΔP. First, it is assumed that the total number of servers 2 in the data center 1 is n. A pressure difference ΔPi demanded for a server i is obtained by the following expression.

$$\Delta Pi = Ri \times Qi$$

Note that i is an integer between 1 and n, inclusive, and Ri is an air resistance of the server i. Qi is a quantity of airflow demanded for the server i, and a description on a method of calculation will be given later. In this manner, a maximum value out of the obtained values ΔP1 to ΔPn is determined to be the given value ΔP.

Figure 4:
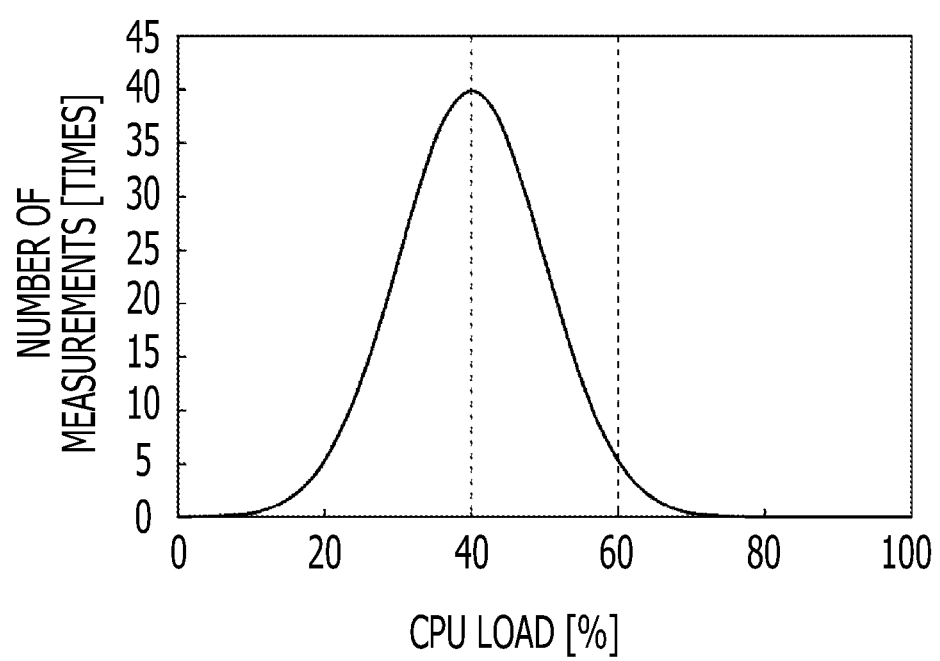
FIG. 4 is a graph illustrating a relationship between a CPU load measured on a CPU mounted on a server and the number of measurements.

Here, a description will be given of an example of a method of calculating a quantity of airflow Qi demanded for the server i with reference to FIG. 4 and FIG. 5. FIG. 4 is a graph illustrating a relationship between a CPU load measured on a CPU installed in the server i, and a number of measurements. From FIG. 4, it is understood that an average value of the CPU load is 40%. The standard deviation of the distribution of the CPU load is σ. If 2σ is added to the average value corresponding to 40%, the resulting value corresponds to 60%. Thus, it is understood that the CPU operates at a load of 60% or lower during 98% of the operation time. Accordingly, the CPU load when calculating Qi is set to 60%.

Figure 5:
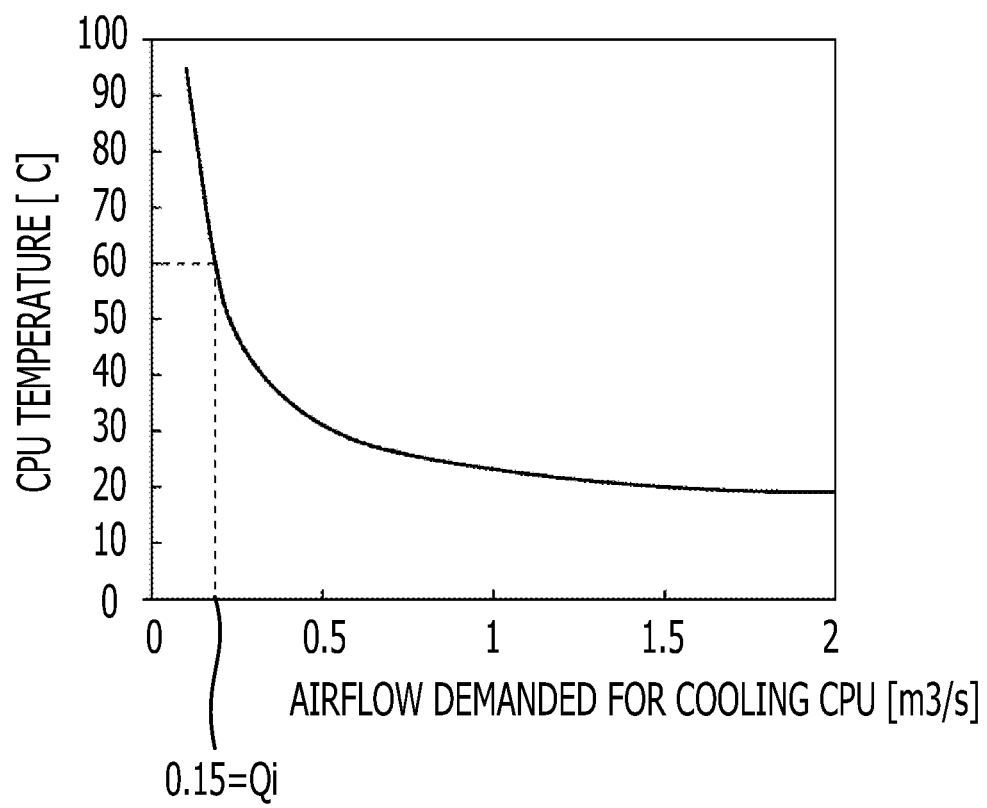
FIG. 5 is a graph illustrating a relationship between a CPU temperature of a server in a state in which a CPU load is 60% and a supply air temperature is 15° C., and an airflow demanded to keep the server at the CPU temperature or less.

FIG. 5 is a graph illustrating a relationship between a CPU temperature of the server i when the CPU load is 60%, the supply air temperature is 15° C., and an airflow demanded to cool the CPU to the given temperature or less. In general, an upper limit of the temperature of a CPU is 70° C. Thus, in order to keep the temperature of a working CPU at 60° C. or less, it is understood from FIG. 5 that the airflow is demanded to be 0.15 m³/s. Accordingly, Qi is determined to be 0.15 m³/s. Based on the determined Qi, ΔPi is obtained as described above and ΔP is determined.

Next, a description will be given of a method to determine the threshold number, x. First, if the number of operating servers is x, power consumption demanded for cooling in each of the modes is calculated. In the first mode, if it is assumed that there are no overheated servers, the airflow of a server fan is zero for any one of the servers. Power consumption $P_1$ in the first mode becomes constant, because an airflow produced by the air conditioner 4 is constant.

Next, in the second mode, it is assumed that an average airflow flowing through each of the servers is q. Thus, power consumption $P_2$ in the second mode is calculated as follows.

$$P_2 = xpq^3 + P(xq)^3$$

Note that p is a characteristic constant of a server fan, P is a characteristic constant of an air conditioner fan included in the air conditioner 4. In this manner, $P_2$ may be calculated because power consumption of each of a server fan and an air conditioner fan is proportional to an airflow to the third power.

If $P_1 = P_2$, the threshold number x is to be obtained (x>0). The threshold number x is calculated by solving the following cubic equation.

$$P_1 = xpq^3 + P(xq)^3$$

Figure 6:
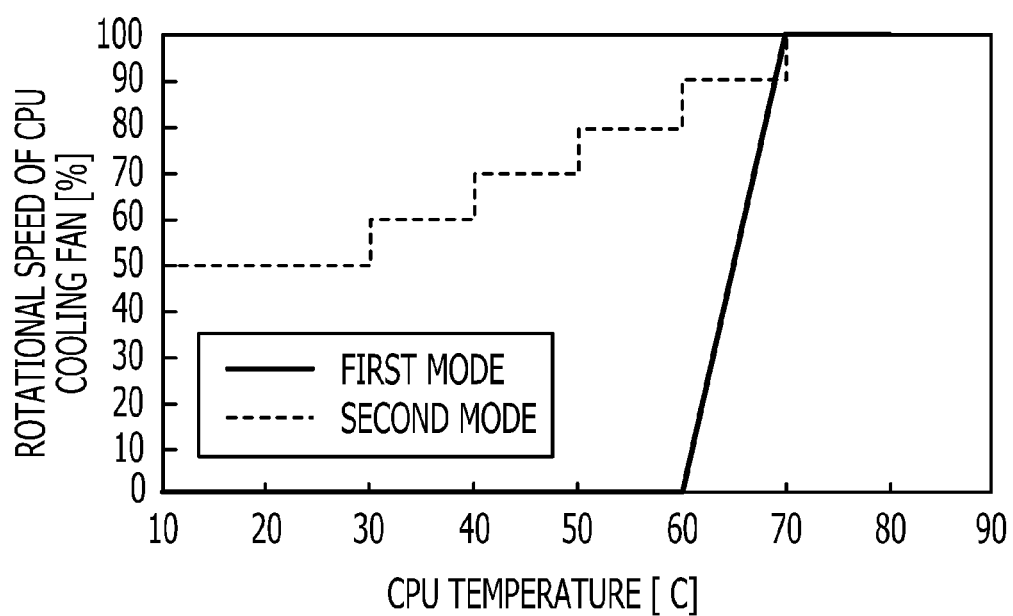
FIG. 6 is a graph illustrating relationships between CPU temperature and rotational speed of a CPU cooling fan, for a server in a first mode and a second mode.

Next, relationships between CPU temperatures of the servers 2 in the first mode and in the second mode, and a rotational speed of the CPU cooling fan 24a, respectively, are illustrated in FIG. 6. In the first mode, unless the CPU 21 is not overheated, that is, as long as the CPU temperature is less than 60° C., the CPU cooling fan 24a is set to a minimum rotational speed as given in a specification. In the example illustrated in FIG. 6, the minimum rotational speed as given in the specification is 0. Only when the CPU temperature is overheated to 60° C. or more is the rotational speed of the CPU cooling fan 24a increased in order to cool the overheated CPU.

In addition, in the second mode, even when the CPU temperature is from 10° C. to 30° C., which is relatively low, the CPU cooling fan 24a is rotated at a rotational speed of 50%, which is higher than the minimum rotational speed as given in the specification. Control is performed so that the rotational speed of the CPU cooling fan 24a increases as the CPU temperature increases. This is because, in the second mode, there is no pressure difference between the cold aisle 6 and the hot aisle 7, and if the CPU cooling fan 24a is not rotated, airflow from the cold aisle 6 to the hot aisle 7 is not generated.

Figure 7:
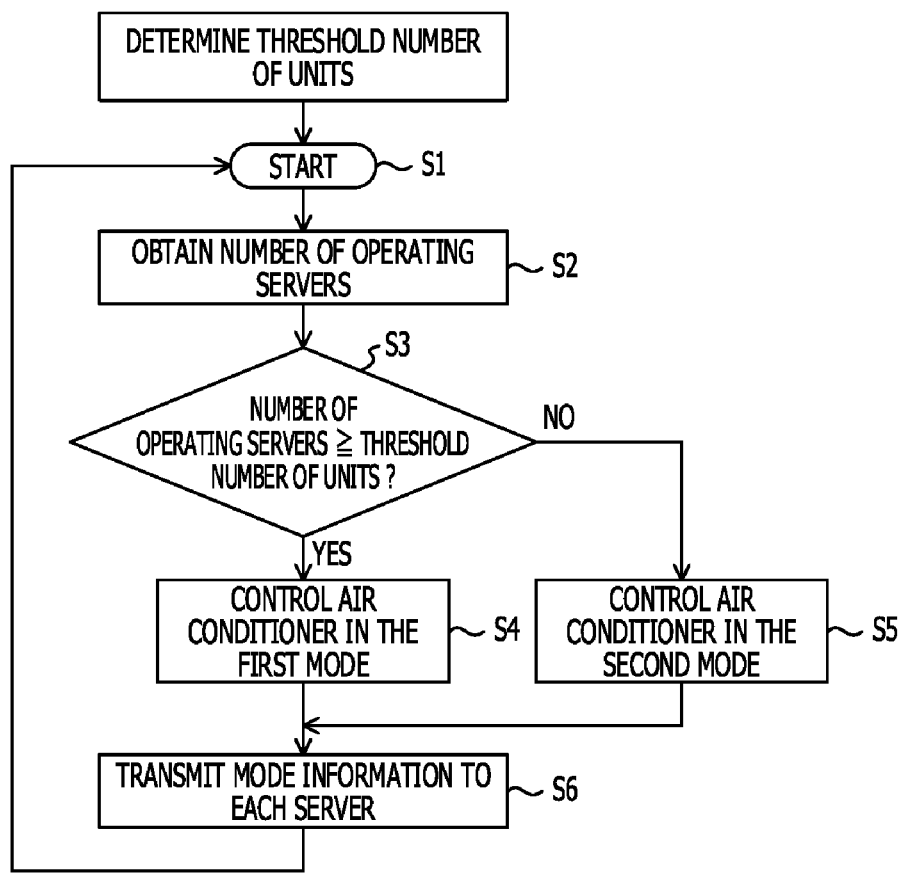
FIG. 7 is a flowchart illustrating processing to change a control mode of an air conditioner 4, which is performed by the air-conditioning control apparatus.

Next, with reference to FIG. 7, a description is given of a change of the control modes of the air conditioner 4, which is performed by the air-conditioning control apparatus 5. First, processing is started in step S1. In step S2, the air-conditioning control apparatus 5 communicates with the servers 2, and obtains the number of operating servers. For example, the air-conditioning control apparatus 5 transmits packets to the individual servers using ping, and then the air-conditioning control apparatus 5 counts the number of operating servers that respond, thereby obtaining the number of operating servers. In step S3, a determination is made of whether the number of operating servers is the threshold number x or more. If the determination result is "Yes", the processing proceeds to step S4, and if not, the processing proceeds to step S5.

In step S4, the air-conditioning control apparatus 5 controls so that the air conditioner 4 is in the first mode. Specifically, the air-conditioning control apparatus 5 controls the air conditioner 4 so that the pressure of the hot aisle 7 becomes equal to the outdoor pressure, and the pressure of the cold aisle 6 becomes higher than the pressure of the hot aisle 7 by ΔP, which is the value calculated in advance.

On the other hand, in step S5, the air-conditioning control apparatus 5 controls so that the air conditioner 4 is in the second mode. Specifically, the air-conditioning control apparatus 5 controls the air conditioner 4 so that the pressure of the hot aisle 7 becomes equal to the outdoor pressure, and the pressure of the cold aisle 6 becomes equal to the pressure of the hot aisle 7.

Next, in step S6, the air-conditioning control apparatus 5 transmits information about the current mode to the servers 2 that are operating. As illustrated in FIG. 6, the servers 2 that have been informed that the current mode is the first mode cause the own server fans to operate at the minimum rotational speed as given in the specification. Only in the case of overheat do the servers 2 increase the rotational speed of their own server fans. Also, the servers 2 that have been informed that the current mode is the second mode, as similarly illustrated in FIG. 6, the servers 2 cause the server fans to operate at the minimum rotational speed, as given in the specification, according to the temperatures of the CPU 21 and the HDD 22.

When the processing in step S6 is ended, the air-conditioning control apparatus 5 waits for a certain time interval, such as 10 minutes or 20 minutes. After that, the processing returns to step S1.

Figure 8:
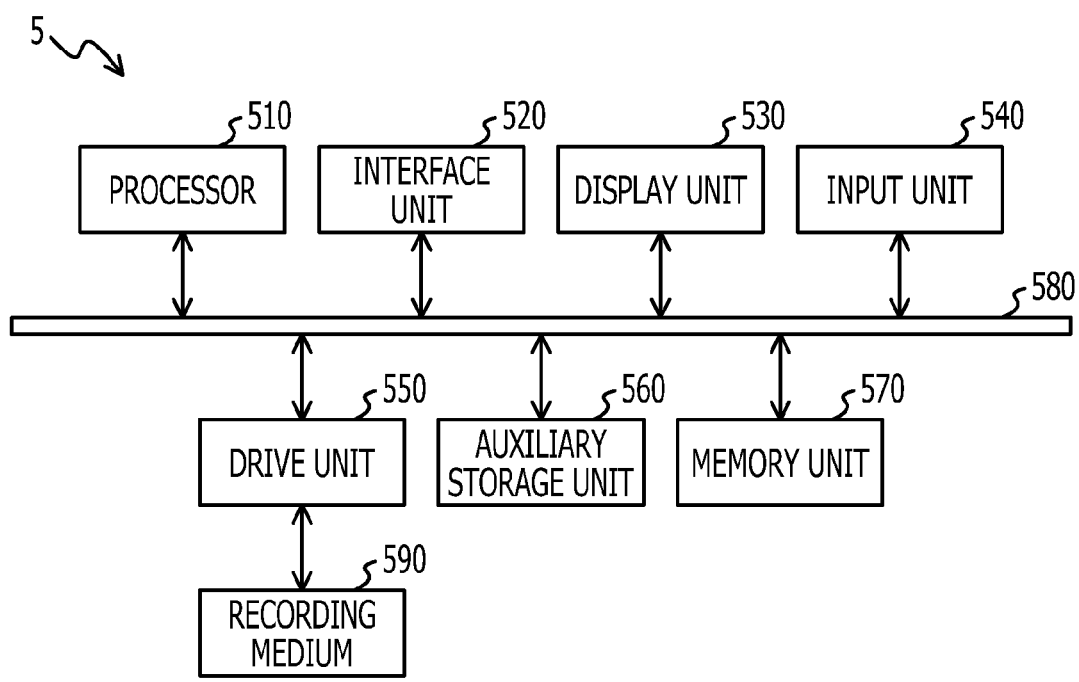
FIG. 8 is a diagram illustrating an example of a hardware configuration of the air-conditioning control apparatus.

FIG. 8 is a diagram illustrating an example of a hardware configuration of the air-conditioning control apparatus 5 that performs the processing illustrated in FIG. 3 and FIG. 7. The air-conditioning control apparatus 5 includes a processor 510, an interface unit 520, a display unit 530, an input device 540, a drive unit 550, an auxiliary storage unit 560, and a memory unit 570, which are mutually connected through a bus 580.

A program for air conditioning control that performs functions of the air-conditioning control apparatus 5 is provided through a recording medium 590, such as a CD-ROM. When the recording medium 590 on which the program is recorded is set in the drive unit 550, the program is installed from the recording medium 590 to the auxiliary storage unit 560 through the drive unit 550. The installation of the program may be carried out in ways other than the recording medium 590. For example, the program may be downloaded from another computer through a network and then installed. The auxiliary storage unit 560 stores the installed program, and also stores information, such as the certain positive value $\Delta P$ and the threshold number x, and the like.

When an instruction to start the program is given, the memory unit 570 reads out the program from the auxiliary storage unit 560 and stores the program. The processor 510 performs functions of the air-conditioning control apparatus 5 according to the program stored in the memory unit 570. The interface unit 520 is used as an interface to connect with the air conditioner 4, the pressure sensors $9a$ to $9c$, and the servers 2. The display unit 530 displays an interface, such as a graphical user interface (GUI), for the program. The input device 540 is, for example, a keyboard and a mouse. The input device 540 is used for the user to input various instructions.

The servers 2 have a substantially similar hardware configuration as that of the air-conditioning control apparatus 5.

In this regard, unlike the above-described embodiment, there is a different method of controlling an airflow of an air conditioner according to temperature of the data center and temperature of parts that dissipate heat in the server, in which the control is performed based on the pressure. In this method, control of the air conditioner is performed independently of control of the server fans.

In a data center having an approximately airtight structure as illustrated in FIG. 1, when the airflow of the air conditioner is controlled according to the temperature as in the above-described different method, cooling may become inefficient because of condition of the server fans mounted on the individual servers. For example, if the airflow of the server fans mounted on each of the servers exceeds the airflow supplied from the air conditioner, the pressure of the hot aisle becomes higher than that of the cold aisle. As a result, hot air in the hot aisle flows back to the cold aisle through servers that are not supplied with electric power, that is, servers with fans not in operation, and thus cooling efficiency is decreased.

In contrast, in the first mode according to the above-described embodiment, the pressure of the cold aisle is set higher than the pressure of the hot aisle, and the operation of the server fan is kept at the minimum given in a specification. Accordingly, the probability of the occurrence of undesirable events between the air conditioner and the server fans is decreased. In the second mode, the air conditioner is controlled so that the pressure of the cold aisle becomes equal to the pressure of the hot aisle. The air conditioner causes the server fans to rotate so that an airflow is generated from the cold aisle to the hot aisle. That is, in either mode, a backward flow of hot air is not generated, and thus cooling efficiency is higher than the above-described different method. In this regard, in the above-described different method, it is desirable to provide devices such as the individual servers and the air conditioners with a large number of airflow sensors or flow rate sensors. On the other hand, in the above-described embodiment, it is sufficient to provide the server with only a few pressure sensors in addition to temperature sensors that are normally mounted.

Further, in the above-described embodiment, it is possible to change the first mode and the second mode according to the number of the servers operating in the data center in order to reduce power consumption of the overall data center.

In contrast, if the air conditioner is controlled in the first mode in which the set pressure difference is uniformly set to $\Delta P$ regardless of the number of the servers operating in the data center, problems may arise. For example, if the number of operating servers is small, cold air is supplied to the large number of the servers that are not operating based on the set pressure difference $\Delta P$. That is, electric power is wasted to cool a large number of servers that are not operating.

Thus, the air-conditioning control apparatus 5 controls the air conditioner not only in the first mode, but by changing between the first mode and the second mode according to the number of the servers operating in the data center. That is, if the number of the servers operating in the data center is small, the air-conditioning control apparatus 5 controls the air conditioner in the second mode, and causes the server fans to rotate in conjunction with that. Here, an airflow of a fan is proportional to a diameter of a fan to the second power and the number of revolutions to the first power, and power consumption of a fan is proportional to the number of revolutions of the fan to the third power. Accordingly, in general, if it is assumed that a supply airflow is constant, power consumption becomes smaller if the air conditioner fans, which have a larger diameter and are smaller in the number than the server fans, are rotated at a low speed than when the server fans, which have a smaller diameter and larger in the number, are rotated at a high speed. Accordingly, the server fans of the operating servers are rotated only if the number of operating servers in the data center is small, and thereby power consumption may be reduced.

According to the above-described embodiment, it is possible to reduce power consumption demanded for the overall data center. In general, power usage effectiveness (PUE) is an index for measuring efficiency of air conditioning. This index is an environmental protection index that is calculated by dividing "power consumption of the overall data center including power consumption of IT devices that includes devices such as the servers in a data center" by "power consumption of the IT devices". However, the power consumption of the IT devices includes power consumption of the fans mounted on the IT devices. Accordingly, even if it is efficient from the viewpoint of PUE, it may be that power consumption of the overall data center is not reduced. In this point, by the above-described embodiment as described above, it may be possible to reduce power consumption of the overall data center including the power consumption of the server fans.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A control method for cooling a plurality of servers disposed in a data center that has a cold aisle and a hot aisle, an airflow from the cold aisle to the hot aisle being conducted through the plurality of servers, the control method comprising:
   counting, by an air-conditioning control apparatus to control an air conditioner configured to supply cold air to the cold aisle and suck hot air out of the hot aisle, a number of operating servers that are in operation among the plurality of servers disposed in the data center;
   generating an air flow from the cold aisle to the hot aisle by controlling the air conditioner in a first mode in which a pressure of the cold aisle is set higher than a pressure of the hot aisle by a predetermined pressure difference, when the acquired number of the operating servers that are in operation among the plurality of servers disposed in the data center is equal to or more than a predetermined threshold;
   controlling the air conditioner in a second mode in which the pressure of the cold aisle is set equal to the pressure of the hot aisle, when the counted number of the operating servers that are in operation among the plurality of servers disposed in the data center is less than the predetermined threshold;
   notifying the operating servers whether a current mode of the air conditioner is the first mode or the second mode; and
   generating, by the operating servers, the air flow from the cold aisle to the hot aisle by driving a fan in each of the operating servers, when a notification that the current mode is the second mode is received from the air-conditioning control apparatus.

2. The control method according to claim 1, wherein the counting further comprises:
   counting a number of operating servers when a first power consumption is equal to a second power consumption, the first power consumption being a power consumption of the air conditioner required for cooling the data center when the air conditioner is operating under the first mode, and the second power consumption being a power consumption of fans in the operating servers required for cooling the data center when the air conditioner is operating under the second mode.

3. The control method according to claim 1, wherein the determining a pressure difference comprises:
   acquiring information of loads of a processor for each of the plurality of servers (N) disposed in the data center;
   calculating, for each of a plurality of servers disposed in the data center, an average value ($\mu$) of the loads of the processor ($x_i$) included in the server;
   calculating a target load by adding double standard deviation ($\sigma$) of a distribution of the loads to the average value, where ($\sigma$) is:

$$\sigma = \sqrt{\frac{1}{N}\sum_{i=1}^{N}(x_i - \mu)^2}\ ;$$

extracting, for each of the plurality of servers, an airflow corresponding to a temperature of the processor under the target load from information indicating a relationship between a target temperature of the processor and an airflow for cooling the processor to the target temperature or less;
   calculating a plurality of pressure differences by multiplying, for each of the plurality of servers, an air resistance of a server by the extracted airflow corresponding to the server; and
   selecting a maximum value among the plurality of pressure differences as the predetermined pressure difference.

4. An air-conditioning control system to cool a plurality of servers disposed in a data center that has a cold aisle and a hot aisle, the air-conditioning control system comprising:
   an air conditioner configured to supply cold air to the cold aisle and suck hot air out of the hot aisle; and
   an air-conditioning control apparatus configured to:
   count a number of operating servers that are in operation among a plurality of servers disposed in the data center,
   generate an air flow from the cold aisle to the hot aisle by controlling the air conditioner in a first mode in which a pressure of the cold aisle is set higher than a pressure of the hot aisle by a predetermined pressure difference, when the acquired number of the operating servers that are in operation among the plurality of servers disposed in the data center is equal to or more than a predetermined threshold,
   control the air conditioner in a second mode in which the pressure of the cold aisle is set equal to the pressure of the hot aisle, when the counted number of the operating servers that are in operation among the plurality of servers disposed in the data center is less than the predetermined threshold, and
   notify the operating servers whether a current mode of the air conditioner is the first mode or the second mode,
   wherein the operating servers are configured to
   generate the air flow from the cold aisle to the hot aisle by driving a fan in each of the operating servers, when a notification that the current mode is the second mode is received from the air-conditioning control apparatus.

5. The air-conditioning control system according to claim 4, further comprising
   calculating a number of operating servers when a first power consumption is equal to a second power consumption, the first power consumption being a power consumption of the air conditioner required for cooling the data center when the air conditioner is operating under the first mode, and the second power consumption being a power consumption of fans in the operating servers required for cooling the data center when the air conditioner is operating under the second mode.

6. The air-conditioning control system according to claim 4, further comprising:
   acquiring information of loads of a processor for each of the plurality of servers (N) disposed in the data center;
   calculating, for each of a plurality of servers disposed in the data center, an average value ($\mu$) of the loads of the processor ($x_i$) included in the server;
   calculating a target load by adding double standard deviation ($\sigma$) of a distribution of the loads to the average value, where ($\sigma$) is:

$$\sigma = \sqrt{\frac{1}{N}\sum_{i=1}^{N}(x_i - \mu)^2}\ ;$$

extracting, for each of the plurality of servers, an airflow corresponding to a temperature of the processor under the target load from information indicating a relationship between a target temperature of the processor and an airflow for cooling the processor to the target temperature or less;

calculating a plurality of pressure differences by multiplying, for each of the plurality of servers, an air resistance of a server by the extracted airflow corresponding to the server; and selecting a maximum value among the plurality of pressure differences as the predetermined pressure difference.

7. The control method according to claim 1, wherein the acquiring includes:

transmitting, by the air-conditioning control apparatus, a packet to each of the plurality of servers using ping; and counting a number of the operating servers that responded to the air-conditioning control apparatus in response to the packet.

8. The control method according to claim 1, wherein the controlling the air conditioner by the first mode includes:

generating an airflow from the cold aisle to the hot aisle, by controlling the air conditioner so that the pressure of the cold aisle becomes higher than the pressure of the hot aisle by a predetermined pressure difference; and cooling the operating servers by the airflow generated by the air conditioner, and wherein the driving the fan at the predetermined rotational speed includes suppressing generation of an airflow from the operating servers to the hot aisle by driving the fan in each of the operating servers at a minimum rotational speed as given in a specification.

9. The control method according to claim 8, wherein the driving the fan at the predetermined rotational speed includes stopping the fan in each of the operating servers to stop generation of the airflow from the operating servers.

10. The control method according to claim 8, wherein the controlling the air conditioner by the second mode includes suppressing generation of the airflow from the cold aisle to the hot aisle, by controlling the air conditioner so that the pressure of the cold aisle becomes equal to the pressure of the hot aisle, and wherein the driving the fan at the rotational speed higher than the predetermined rotational speed includes generating an airflow from the operating servers to the hot aisle, by driving the fan in each of the operating servers at a rotational speed higher than the minimum rotational speed given in the specification, and cooling the operating servers by the airflow generated by the operating servers.

11. The control method according to claim 1, wherein the fan in each of the operating servers is configured to;

maintain a rotational speed of the fan for cooling a processor at zero, when the operating servers are operating under the first mode and when it is determined that a temperature of the processor is less than a predetermined temperature, and increase the rotational speed of the fan as the temperature of the processor increases till reaching a maximum speed, when the operating servers are operating under the first mode and when it is determined that the temperature of the processor becomes equal to or more than the predetermined temperature.

12. The control method according to claim 11, wherein the fan in each of the operating servers is configured to control the fan so that rotational speed of the fan increases as the temperature of the processor increases, when the operating servers are operating under the second mode.

* * * * *